US006602348B1

(12) United States Patent
Rogelstad

(10) Patent No.: US 6,602,348 B1
(45) Date of Patent: Aug. 5, 2003

(54) SUBSTRATE COOLDOWN CHAMBER

(75) Inventor: Terrance R. Rogelstad, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 987 days.

(21) Appl. No.: 08/713,882

(22) Filed: Sep. 17, 1996

(51) Int. Cl.$^7$ .......................... C23C 16/00; C23C 14/00; C23F 1/00; B05D 3/00
(52) U.S. Cl. .................. 118/719; 118/724; 156/345.31; 156/345.32; 156/345.53; 204/298.09; 204/298.25; 165/86; 165/80.1; 165/80.5; 427/398.1; 427/395.2; 427/398.4; 427/398.5
(58) Field of Search ................................ 118/719, 724; 156/345, 345.31, 345.32, 345.53; 204/298.09, 298.25; 165/80.1, 80.2, 80.4, 80.5, 86; 427/398.1, 398.2, 398.3, 398.4, 398.5

(56) References Cited

U.S. PATENT DOCUMENTS

| | | | |
|---|---|---|---|
| 4,512,391 A | | 4/1985 | Harra |
| 5,002,010 A | * | 3/1991 | Weinberg .................... 118/719 |
| 5,186,718 A | * | 2/1993 | Tepman et al. ............. 29/25.01 |
| 5,474,410 A | * | 12/1995 | Ozawa et al. ................ 414/217 |
| 5,509,464 A | | 4/1996 | Turner et al. ............... 165/80.2 |
| 5,512,320 A | * | 4/1996 | Turner et al. ................ 427/255 |
| 5,516,367 A | * | 5/1996 | Lei et al. ..................... 118/725 |
| 5,607,009 A | * | 3/1997 | Turner et al. .............. 165/48.1 |
| 5,609,689 A | * | 3/1997 | Kato et al. ................... 118/719 |
| 5,698,989 A | * | 12/1997 | Nulman ....................... 324/719 |
| 5,707,500 A | * | 1/1998 | Shimamura et al. ... 204/298.03 |
| 5,837,555 A | * | 11/1998 | Kaltenbrunner et al. .... 437/248 |

FOREIGN PATENT DOCUMENTS

| | | | |
|---|---|---|---|
| EP | 0 323 620 | 12/1988 | ........... H01L/21/00 |
| EP | 0 325 243 | 1/1989 | ........... H01J/37/32 |
| EP | 0 469 469 | 7/1991 | ......... H01L/21/306 |
| EP | 0 628 989 | 6/1994 | ........... H01L/21/00 |
| JP | 59-172730 | * 9/1984 | |

OTHER PUBLICATIONS

PCT International Search Report Nov. 29, 2002.

* cited by examiner

Primary Examiner—Jeffrie R. Lund
(74) Attorney, Agent, or Firm—Moser Patterson & Sheridan, LLP

(57) ABSTRACT

The present invention provides a cooldown chamber allowing more efficient and rapid cooling of a substrate. The substrate is cooled in the cooldown chamber utilizing a pair of cooling members, preferably mating "clam shell" style members, positioned adjacent the top and bottom surfaces of the substrate. While the top surface of the substrate should not be contacted directly, the upper cooling member can approach the substrate surface, preferably to within about 0.01 to about 0.03 inches. The bottom cooling member should also approach the bottom substrate surface, preferably making contact or being within about 0.01 to about 0.03 inches. With the cooling members closed to define an enclosure around a hot substrate, an inert gas is supplied into the enclosure at pressures between about 5 and about 30 torr to allow efficient thermal conduction from the substrate to the cooling members. After the substrate has been given a sufficient amount of time to cool, the cooling members are separated and the high pressure gas within the enclosure is allowed to escape and diffuse into the gases occupying the remaining volume of the cooldown chamber.

34 Claims, 9 Drawing Sheets

SUBSTRATE COOLDOWN CHAMBER

BACKGROUND OF THE INVENTION

1. Field of the Invention

The present invention relates generally to cooldown chambers for use in integrated circuit fabrication processes. More particularly, the present invention relates to an improved cooldown chamber providing more rapid cooldown of a substrate containing a lower volume of cooling gas.

2. Background of the Related Art

Fabricating integrated circuit structures on silicon wafers requires the deposition and etching of multiple layers of metals, dielectrics, and semiconductors. These processes include chemical vapor deposition, physical vapor deposition, dielectric depositions, various etching processes, and the like. Many of these processes take place in the presence of a plasma or otherwise occur at elevated temperatures. Therefore, the substrate and film layers formed thereon must periodically be cooled either between the process steps or before withdrawal of the wafer from a controlled environment, such as that of a cluster tool.

Typically, the cooling of a substrate and the films formed thereon is performed in a cooldown chamber. This chamber is attached to a cluster tool and is dedicated to the cooling of wafers to temperatures at which the integrity of the films is preserved. Typical cooldown chambers comprise an enclosure having a slit valve allowing access from a buffer chamber of a cluster tool. The cooldown chamber, like the buffer chamber, is preferably operated at relatively high pressures of about 20 torr. The cooldown chamber is operated at these pressures or greater in order to achieve sufficient thermal heat conduction from the substrate to the surrounding environment. Cooldown chambers are equipped with a pedestal having a cooling member formed therein to receive a substrate and absorb a majority of the thermal energy released from the substrate. In applications where the cooldown chamber is operated at a pressure higher than that of the buffer chamber, it has been common to incorporate a slit valve between the cooldown chamber and the buffer chamber to contain the higher pressure. Once the substrate has been cooled, the slit valve is opened and the higher pressure gas from the cooldown chamber is allowed to escape into the buffer chamber. While this creates a high pressure event in the buffer chamber, this higher pressure has typically been tolerated.

To increase the throughput of substrates through a cluster tool, it is generally beneficial that each individual process step occur as quickly as possible. In a case of a cooldown chamber, it is desirable for the substrate to be cooled in an efficient and timely fashion and sent on to the next chamber for further processing, leaving the cooldown chamber ready to cool yet another substrate. It is therefore desirable to maximize the efficient cooling of the substrate in a cooldown chamber.

The transfer of thermal energy from the substrate to the cooling member can occur, in varying proportions, through thermal radiation, thermal conduction and convection. In order to provide efficient thermal conduction from the substrate to any solid body within the cooldown chamber, the cooldown chamber is typically operated at pressures of at least 20 torr. These pressures are necessary to provide a sufficient density of gas molecules to transfer heat between adjacent surfaces. Even face-to-face contact between the substrate surface and a cooling member does not provide efficient heat transfer in a vacuum, because the uneven surfaces of the substrate and cooling member create pockets which, in the absence of sufficient gas molecules, provide insulation between the two members.

Furthermore, the rate of heat transfer due to thermal radiation and convection is much slower than thermal conduction. Therefore, efficient cooling chamber designs rely primarily on thermal conduction. In operation of the cooldown chamber, a robot blade inserts a hot substrate through the slit valve into the cooldown chamber, where the substrate is received on a plurality of receiving pins. The robot blade is then withdrawn from the chamber and the slit valve is closed. The lift pins may then lower the wafer down onto the substrate receiving surface of the cooling member. With the substrate positioned on the cooling member, the substrate is allowed to cool over a period of time sufficient to stabilize the substrate films. After this period of time has passed, the slit valve is opened and the substrate is withdrawn from the cooldown chamber by the robot and transferred to either a subsequent process or the load lock cassette for withdrawal from the cluster tool.

However, this simple cooldown chamber is incompatible with several processes commonly used in semiconductor fabrication. For example, if the cooldown chamber just described was attached to a cluster tool having a PVD deposition chamber attached to a common buffer chamber, the high pressure excursion caused by the opening of the slit valve between the cooldown chamber and the buffer chamber can easily cause contamination of the PVD chamber upon opening of the PVD slit valve. Therefore, it is critical that the cooldown chamber slit valve and PVD chamber slit valve never be opened at the same time. In fact, the PVD chamber slit valve should not be opened until the pressure in the buffer chamber is again drawn down to its operating pressure. While the cooldown chamber is typically filled within an inert gas, high pressure gas rushing through the buffer chamber into the PVD chamber could contaminate the PVD chamber with particles generated by the robot and other substrate transfer processes.

Pressure excursions in the buffer chamber can be reduced or eliminated by the addition of a vacuum pump to the cooldown chamber. In operation, the vacuum pump would be used to reduce the pressure in the cooldown chamber to that equal to or below the pressure in the buffer chamber prior to opening the slit valve and removing the substrate. However, this solution adds additional auxiliary equipment, maintenance and expense to the cluster tool. Furthermore, and perhaps more importantly, adding a vacuum pumping step to the substrate cooling process adds a considerable amount of processing time.

Therefore, there is a need for a cooldown chamber that provides rapid cooling of a substrate. More particularly, there is a need for a cooldown chamber that is compatible with low pressure processes. It would be desirable if the cooldown chamber could operate at high pressure to maximize thermal conductance, yet minimize or eliminate pressure excursions in the buffer chamber. It would be further desirable if the cooldown chamber required only a minimum volume of high pressure gas in order to reduce the magnitude of the pressure excursion or, alternatively, reduce the amount of time required to pump and evacuate the gas.

SUMMARY OF THE INVENTION

The present invention provides a cooldown chamber having an enclosure and a passageway between the enclosure and a buffer chamber of a cluster tool. The cooldown chamber utilizes a first cooling member coupled to an inside wall of the enclosure and a second cooling member coupled to a pedestal for receiving a substrate thereon, wherein the second cooling member can be selectively positioned adjacent the first cooling member to form a cooling region therebetween. A gas source provides an inert gas, preferably nitrogen or helium, to the cooling region. It is preferred that the cooling members be in fluid communication with a source of a cooling fluid, such as chilled water.

In one aspect of the invention, the passageway between the enclosure and a buffer chamber contains a slit valve to isolate the cooldown chamber. The cooldown chamber may also include an exhaust port and a vacuum pump for evacuating the inert gas from the cooldown chamber before opening the slit valve.

In another aspect of the invention, the cooldown chamber has a second passageway between the enclosure and a second buffer chamber of a cluster tool, wherein the second passageway includes a slit valve. In this manner, the cooldown chamber can also serve as a loadlock between buffer chambers that also operate at different conditions or pressures.

In yet another aspect of the invention, a substrate is cooled at an increased rate by positioning the cooling members within about 0.01 and about 0.03 inches from the substrate surfaces. Furthermore, one or both of the cooling members may have a rim extending a sufficient distance towards the other cooling member that the cooling members can be selectively positioned to form a cooling cavity containing the substrate. The cooling rate is also increased by providing an inert gas to the cavity at a pressure greater than about 5 torr in the cavity, preferably between about 5 and about 30 torr, and most preferably about 20 torr.

The invention also provides a method for operating a high pressure cooldown chamber on a cluster tool having a low pressure transfer chamber, comprising the steps of (a) transferring a substrate from the transfer chamber into the cooldown chamber, wherein the cooldown chamber comprises: (i) an enclosure; (ii) a passageway between the enclosure and a buffer chamber of a cluster tool; (iii) a first cooling member coupled to an inside wall of the enclosure; (iv) a second cooling member coupled to a pedestal for receiving a substrate thereon; and (v) a gas source for providing inert gas between the first and second cooling members; (b) receiving the substrate on the second cooling member; (c) positioning the second cooling member in a sealing relationship with the first cooling member to form a cooling cavity therebetween, wherein the cavity contains the substrate; (d) flowing an inert gas into the cooling cavity at a pressure that is greater than the pressure in the transfer chamber; and (e) cooling the substrate. It is also preferred that the gas-containing volume of the cooling cavity be less than the cooldown chamber volume, preferably less than about 10 percent.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DESCRIPTION OF A PREFERRED EMBODIMENT

Figure 1:
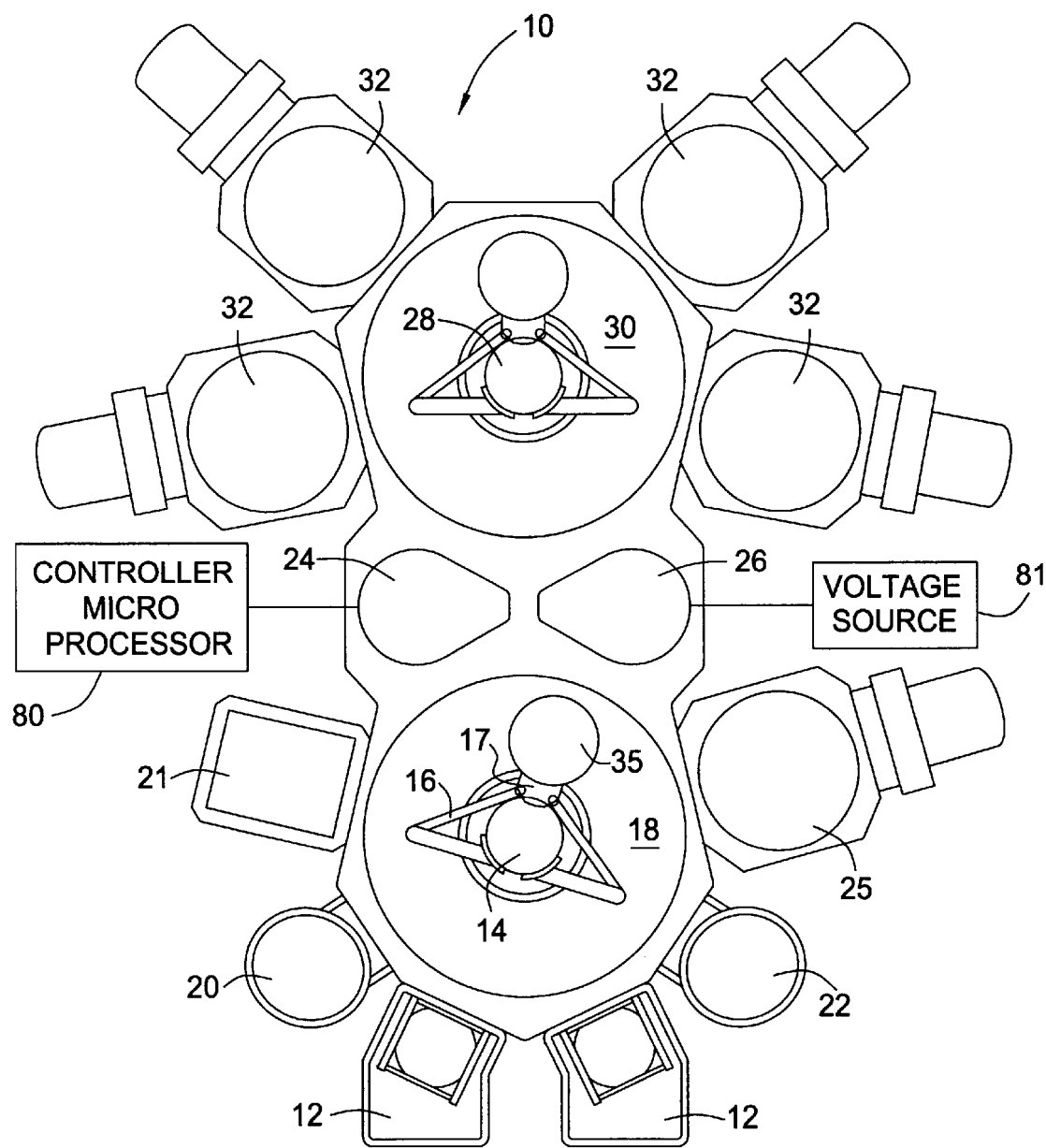
FIG. 1 is a schematic view of a cluster tool containing a cooldown chamber of the present invention.

The present invention provides a cooldown chamber allowing more efficient and rapid cooling of a substrate. The substrate is cooled in the cooldown chamber utilizing a pair of cooling members, preferably mating "clam shell" style members, positioned adjacent the top and bottom surfaces of the substrate. While the top surface of the substrate should not be contacted directly, the upper cooling member can approach the substrate surface, preferably to within about 0.01 to about 0.03 inches. The bottom cooling member should also approach the bottom substrate surface, preferably making contact or being within about 0.01 to about 0.03 inches. With the cooling members in contact to define an enclosure around a hot substrate, an inert gas is supplied into the enclosure at sufficient pressure to allow efficient thermal conduction from the substrate to the cooling members. After the substrate has been given a sufficient amount of time to cool, the cooling members are separated and the high pressure gas within the enclosure is allowed to escape and diffuse into the gases occupying the remaining volume of the cooldown chamber.

In one aspect of the invention, the cooldown chamber is in fluid communication with the buffer chamber through a small opening for the transfer of substrates with no slit valve therebetween. It is desirable to minimize the size of the opening so that any rise in pressure within the buffer chamber due to a pressure differential in the cooldown chamber occurs slowly. Furthermore, because the enclosure defined by the cooling members contains a relatively small volume of high pressure gas as compared with the total gas-containing volume of the cooldown chamber and buffer chamber, the high pressure is rapidly dissipated. The magnitude of the high pressure excursion in the buffer chamber is greatly reduced from that caused by a conventional cooldown chamber.

In another aspect of the invention, the cooldown chamber may be isolated from the buffer chamber by a slit valve. Because the enclosure defined by the cooling members contains a relatively small volume of high pressure gas as compared with the gas-containing volume of the cooldown chamber alone, the high pressure is rapidly dissipated within the cooldown chamber. Opening the slit valve will therefore cause a much smaller pressure excursion in the buffer chamber than an excursion caused by a conventional cooldown chamber.

In yet another aspect of the invention, a cooldown chamber having a slit valve is also equipped with a pump to pull a vacuum on the cooldown chamber prior to opening the slit valve. This aspect of the invention can dramatically reduce or eliminate any pressure excursion within the buffer chamber.

In still another aspect of the invention, a cooldown chamber has two slit valves for communicating substrates between first and second buffer chambers. The two slit valves allow the cooldown chamber to cool substrates from both the first and second buffer chambers as well as performing the function of a loadlock.

Now referring to FIG. 1, a schematic diagram of an integrated cluster tool 10 having a cooldown chamber 22 of the present invention is shown. Typically, substrates are introduced and withdrawn from the cluster tool 10 through a cassette loadlock 12. A robot 14 having a blade 17 with a blade extension system 16 is located within the cluster tool 10 to move the substrates through the cluster tool 10. One robot 14 is typically positioned in a buffer chamber 18 to transfer substrates between the cassette loadlock 12 and a plurality of chambers, such as a degas wafer orientation chamber 20, preclean chamber 21, cooldown chamber 22 and PVD chamber 25. A second robot 28 is located in transfer chamber 30 to transfer substrates to and from the chamber 26 and other processing chambers 32. The transfer chamber 30 in the integrated system is preferably maintained at low/high pressure vacuum in the range of $10^{-3}$ to $10^{-8}$ torr. This configuration of chambers in FIG. 1 comprises an integrated processing system capable of both CVD and PVD processes in a single cluster tool. However, this chamber configuration is merely illustrative and should not be taken as limiting the application of the present invention.

Typically, a substrate processed in the cluster tool 10 is passed from the cassette loadlock 12 to the buffer chamber 18 where the robot 14 first moves the substrate into a degas chamber 20. The substrate may then be transferred into preclean chamber 24, processed in PVD chamber 25, and then placed into the cooldown chamber 22. From the cooldown chamber 22, the robot 14 typically moves the substrate into and between one or more processing chambers 32 before returning the substrate back to the cooldown chamber 22. It is anticipated that the substrate may be processed or cooled in one or more chambers any number of times in any order to accomplish fabrication of a desired structure on the substrate. The substrate is removed from the cluster tool 10, following processing, through the buffer chamber 18 and then to the loadlock 12. A microprocessor controller 80 is provided to control the sequence and formation of the desired film layers on the substrates. A voltage source 81 is connected to the cluster tool 10 for the processing of substrates.

Alternatively, the cooldown chamber of the present invention may be incorporated into the cluster tool at the position indicated by chamber 26. In this position, the cooldown chamber must include two slit valves to function as a load lock between the buffer chamber 18 and transfer chamber 30.

Figure 2:
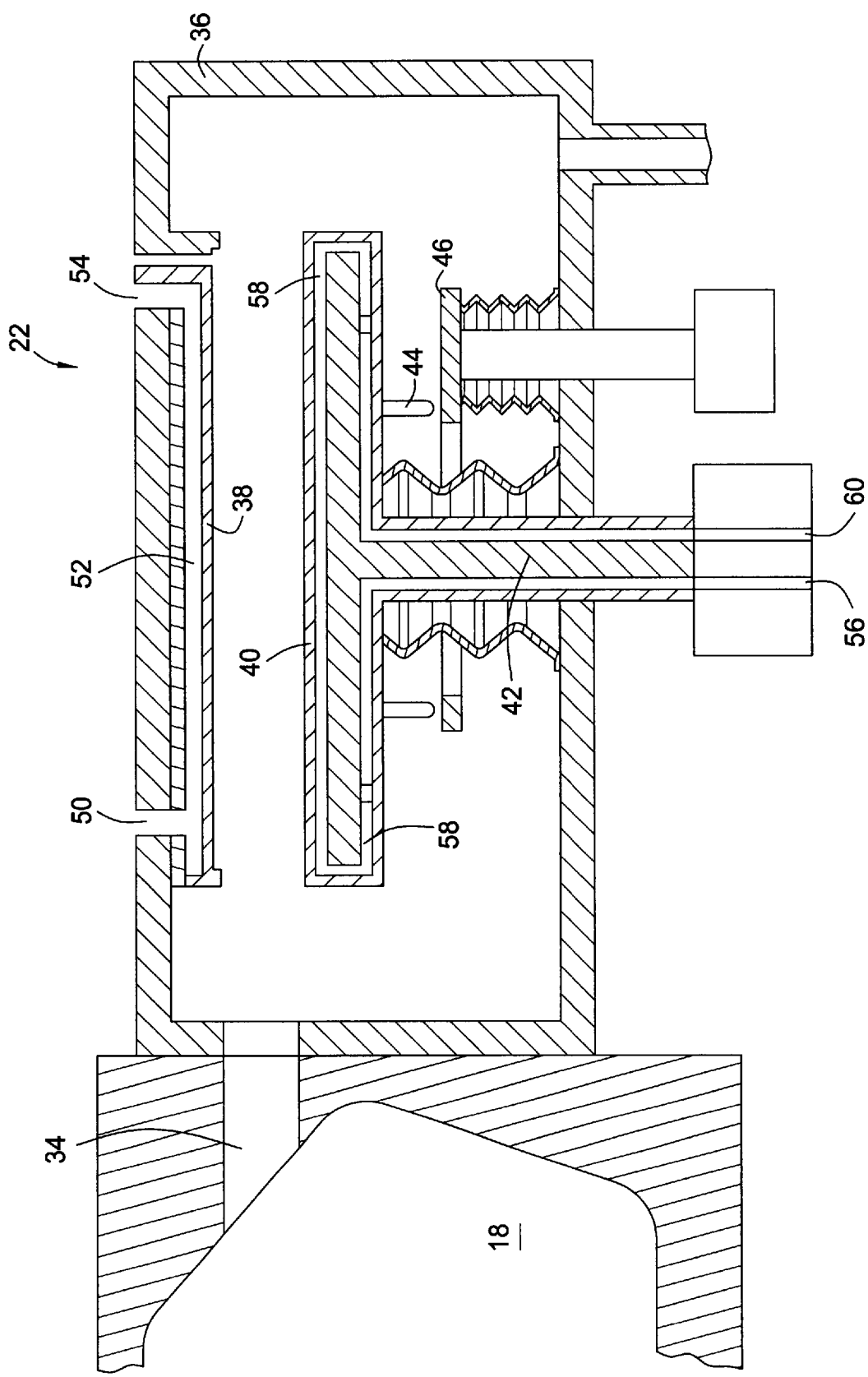
FIGS. 2–6 are cross-sectional views of a cooldown chamber attached to a buffer chamber illustrating the sequence of steps for introducing a wafer to the cooldown chamber, cooling the wafer, and withdrawing the wafer from the cooldown chamber.

Now referring to FIG. 2, a cross-sectional view of the cooldown chamber 22 of FIG. 1 is shown. The cooldown chamber is attached to the side of buffer chamber 18 of the cluster tool 10 (See FIG. 1) and is in fluid communication with the buffer chamber 18 through opening 34. The cooldown chamber itself is comprised of an enclosure 36 having a cooling member therein.

The cooling members of the present invention include a top cooling member 38 and a bottom cooling member 40 that is attached to a pedestal 42, wherein the pedestal 42 is equipped with lift pins 44 and a lift pin platform 46. The top cooling member 38 is equipped with a cooling fluid inlet 50 in communication with a source of a cooling fluid, internal cooling channels 52, and a cooling fluid outlet 54. Similarly, the bottom cooling member 40 is equipped with a cooling fluid inlet 56 in communication with a cooling fluid source, internal cooling channels 58, and a cooling fluid outlet 60. The cooling fluid may be either a gas or liquid, but the preferred cooling fluid is chilled water. The cooling fluid preferably is maintained at a temperature below room temperature (about 25° C.). It is most preferable that the cooling fluid have a sufficiently high flow rate and a sufficiently low temperature to maintain the cooling members at about 25° C.

In the description that follows, the invention will be described with regards to a cooldown chamber including both a slit valve and a vacuum pump. However, it should be noted that both the slit valve and the vacuum pump are optional within the scope of the present invention.

Now referring to FIGS. 2–6, the operation of the cooldown chamber 22 of the present invention will be described more particularly. In FIG. 2, the cooldown chamber 22, as described above, is ready to receive and cool a substrate. The lift pins 44 and lift pin platform 46, as well as the pedestal 42, are in the down position.

Figure 3:
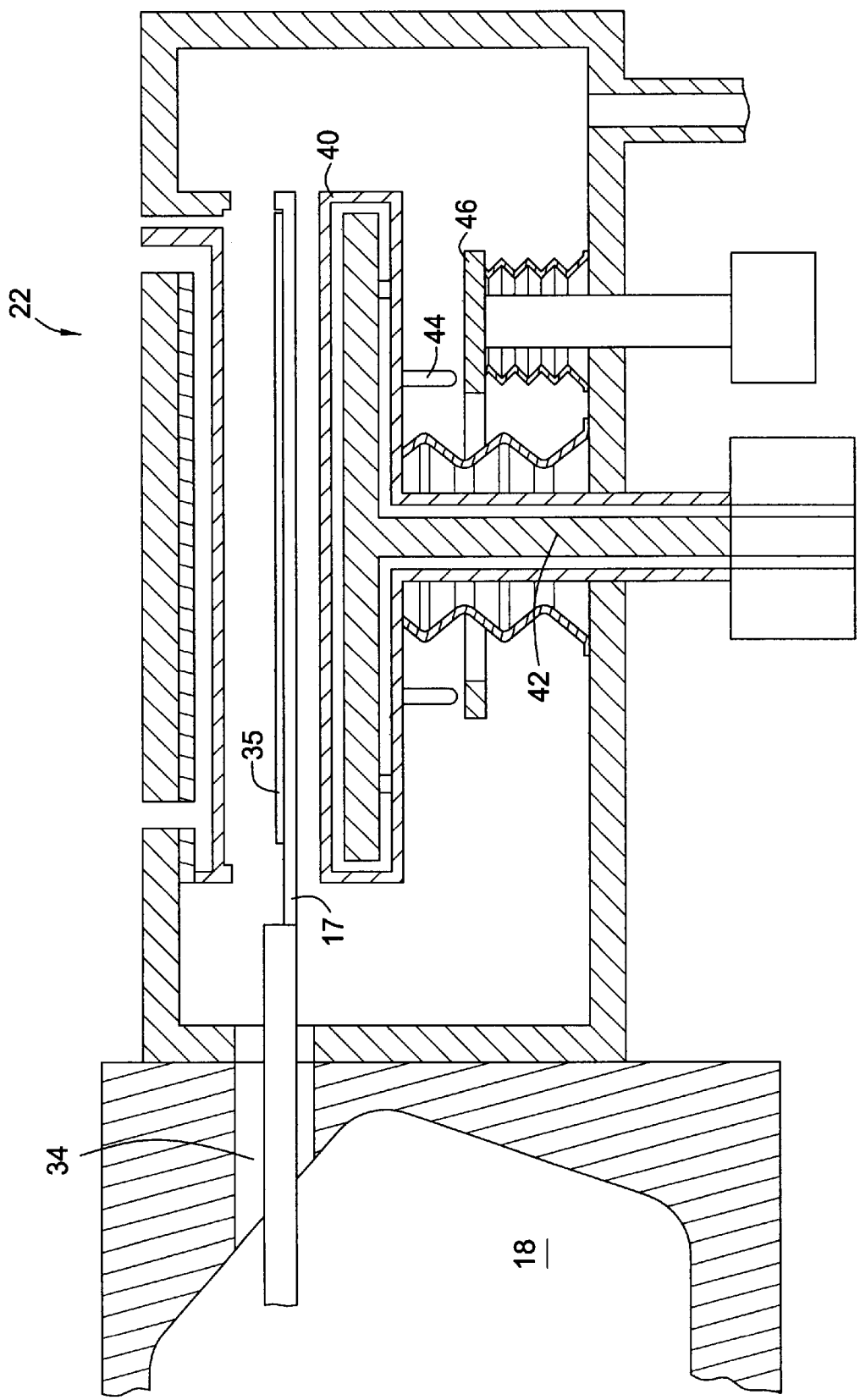

Now referring to FIG. 3, the robot blade 17 bearing a substrate 35 is extended through the slit valve 34 and into the chamber 22 to a position aligned above the lower cooling member 40. It is preferred that the slit valve opening 34 be no larger than necessary to deliver the substrate to the chamber.

Figure 4:
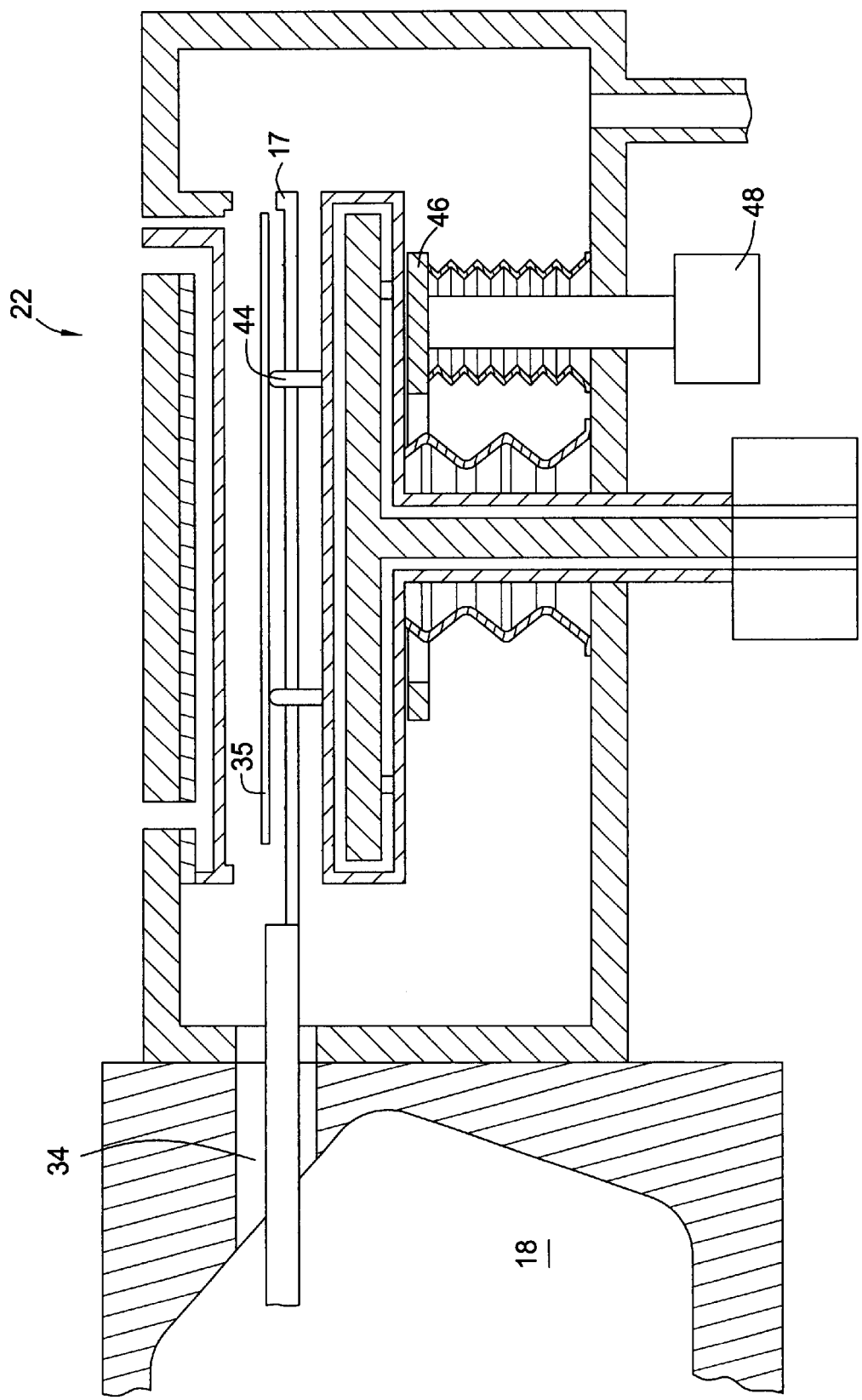

Now referring to FIG. 4, the lift pin platform 46 has been actuated upward by the motor 48 raising the lift pins 44 sufficiently so that the upper tips of the lift pins 44 lift the substrate 35 from the robot blade 17 so that the blade can be withdrawn from the chamber.

Figure 2A:
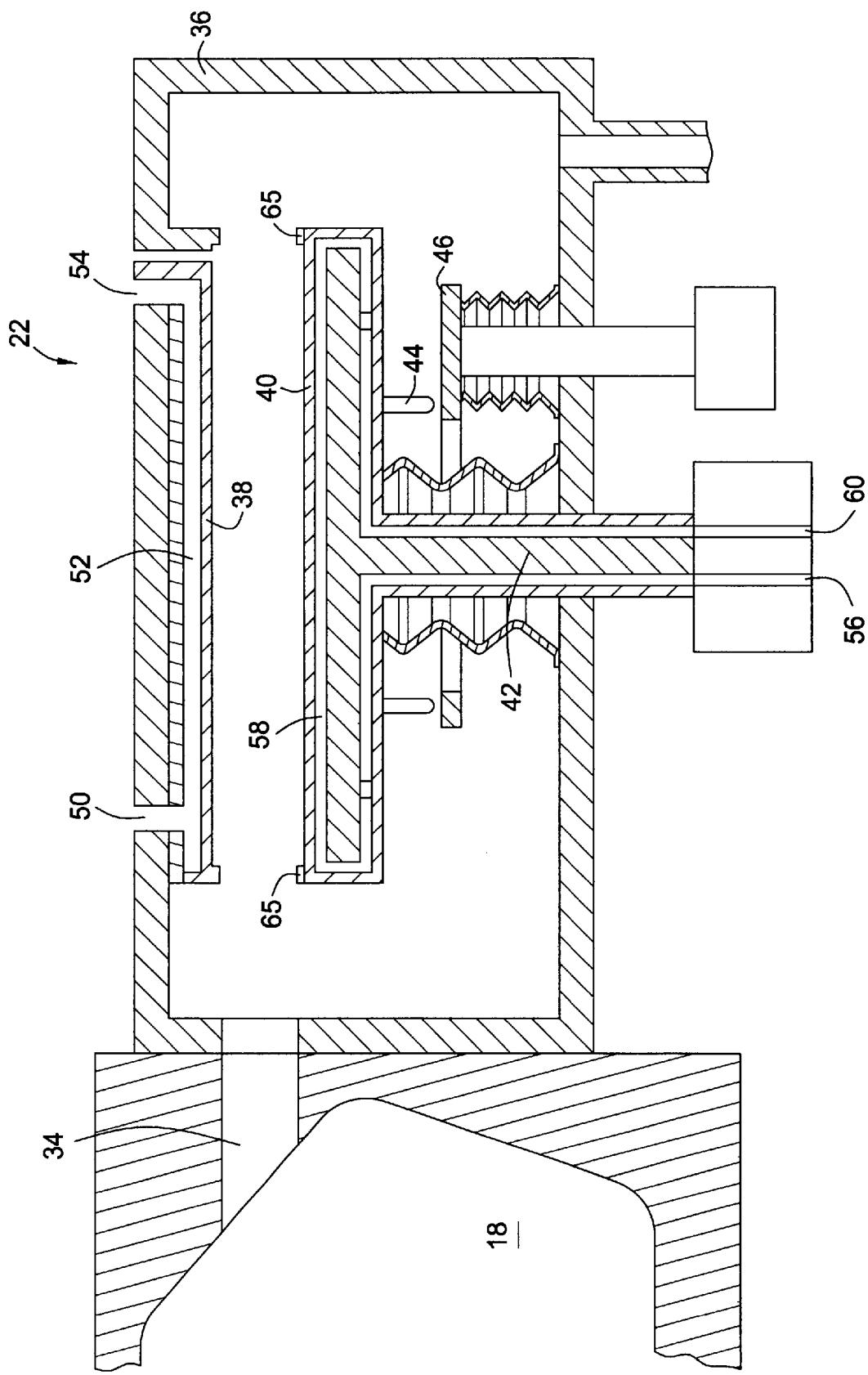
FIG. 2A shows a cross-sectional view of an alternative configuration of the cooldown chamber.
Figure 5:
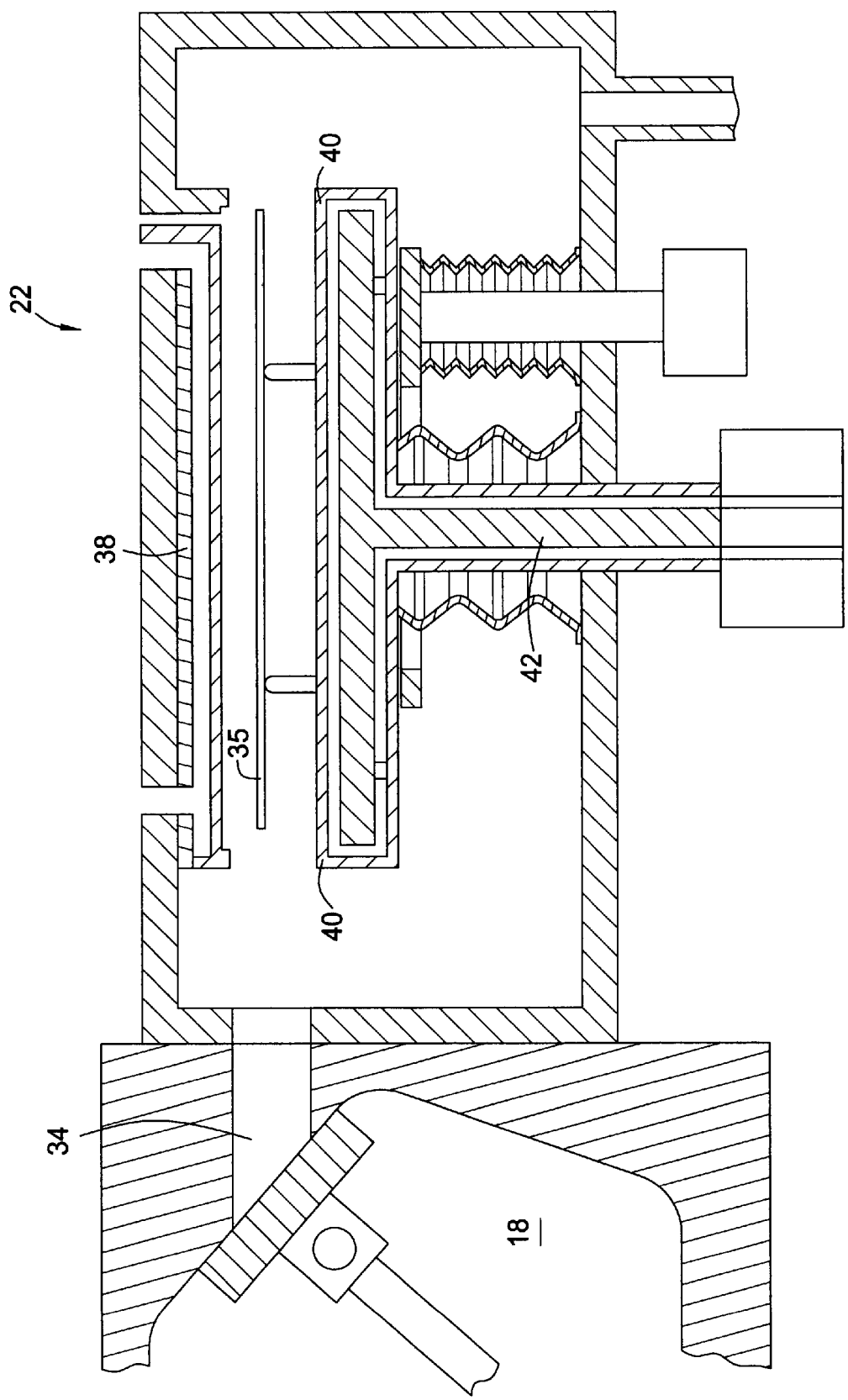
Figure 6:
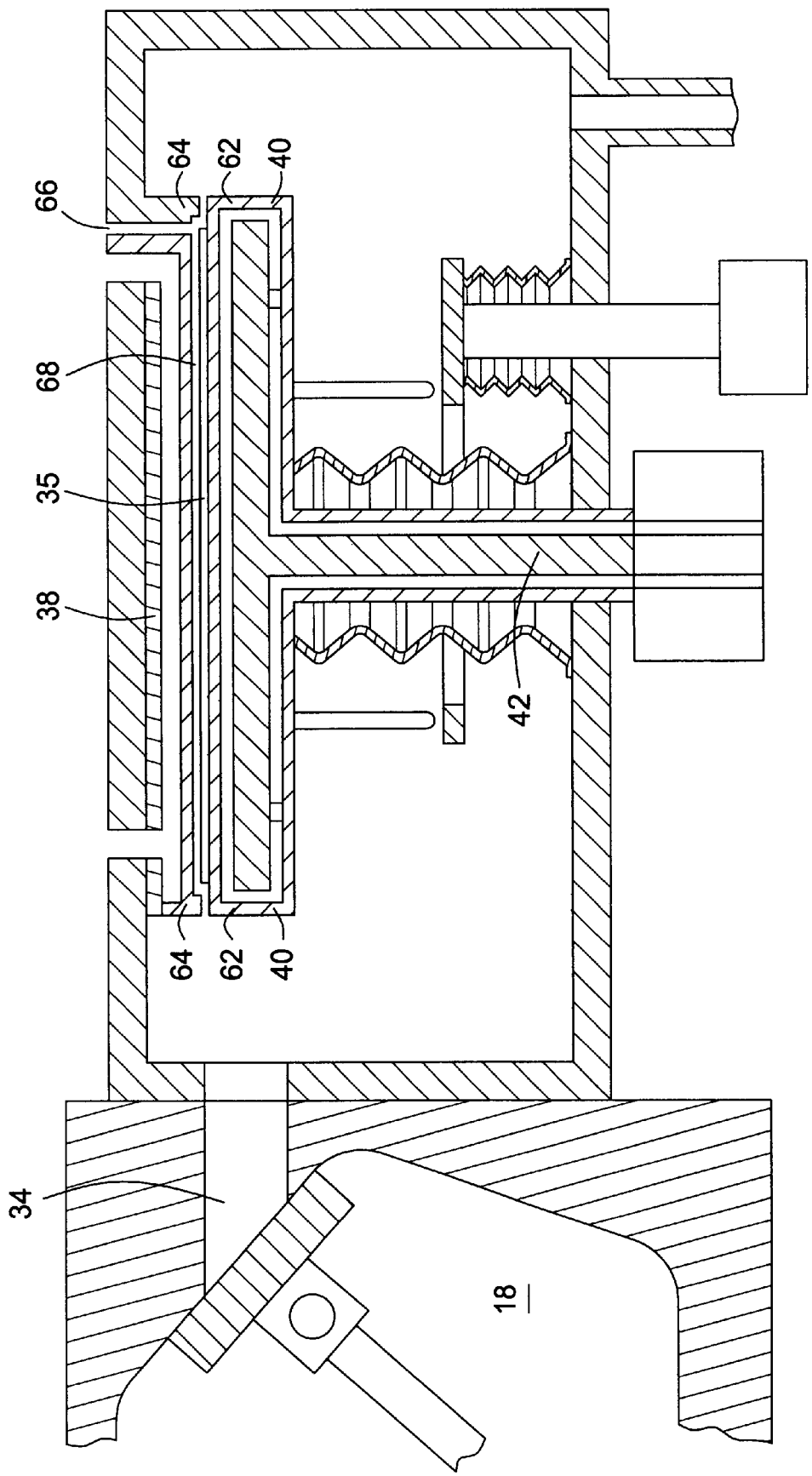

Referring now to FIG. 5, the robot blade 17 has been removed and the slit valve 34 has been closed. In FIG. 6, the pedestal 42 containing the lower cooling member 40 has been raised to contact the bottom surface of the substrate 35 and lift it upward toward the top cooling member 38. The bottom cooling member 40 is raised until its perimeter edge 62 comes into contact with the rim 64 of the top cooling member 38. Alternatively, as shown in FIG. 2A, the second or bottom cooling member 40 may have a second rim 65 extending towards the first rim 64 on the first cooling member 38. Similarly, the bottom cooling member 40 is raised until the second rim 65 comes into contact with the first rim 64 of the top cooling member 38. In this position, the top and bottom cooling members 38,40 form a small enclosure in which the substrate 35 is cooled. The gas-containing volume of the cooling cavity is less than about 10 percent of the cooldown chamber volume.

In order to cool the substrate, an inert gas, preferably nitrogen or helium, is pressurized through the gas inlet 66 into the space 68 surrounding the substrate 35 and within the enclosure defined by the clam shell cooling members 38,40. While the surfaces of the cooling members that define the space 68 may be given many profiles, it is generally preferred that the cooling member surfaces adjacent the substrate have a grooved pattern similar to those incorporated for cooling on the surface of an electrostatic chuck. Because gas diffuses rapidly within the enclosure, it is generally not necessary that the gas be distributed throughout the channels but, rather, it is generally sufficient to inject the gas at a single point and allow the gas to pass through the channels or gaps and flow around the substrate. The inert gas is allowed to pass into space 68 until the back pressure measures between about 5 and about 20 torr. Depending upon the type of seal formed between the bottom cooling member edge 62 and the top cooling member rim 64, it may be necessary to continue supplying gas to the space 68 in order to maintain the pressure until the cooling period is completed. Additionally, depending upon the type of seal formed between the bottom cooling member rim 65 and the top cooling member rim 64, it may be necessary to continue supplying gas to the space 68 in order to maintain the pressure until the cooling period is completed.

It should be recognized that the substrate 35 is removed by reversing the sequence of steps taken to deliver the substrate. Namely, the pedestal 42 is lowered, the lift pins 44 and substrate 35 are raised, the robot blade 17 is inserted, the lift pins 44 and substrate 35 are lowered, and the robot blade 17 carrying the substrate 35 is withdrawn.

Figure 7A:
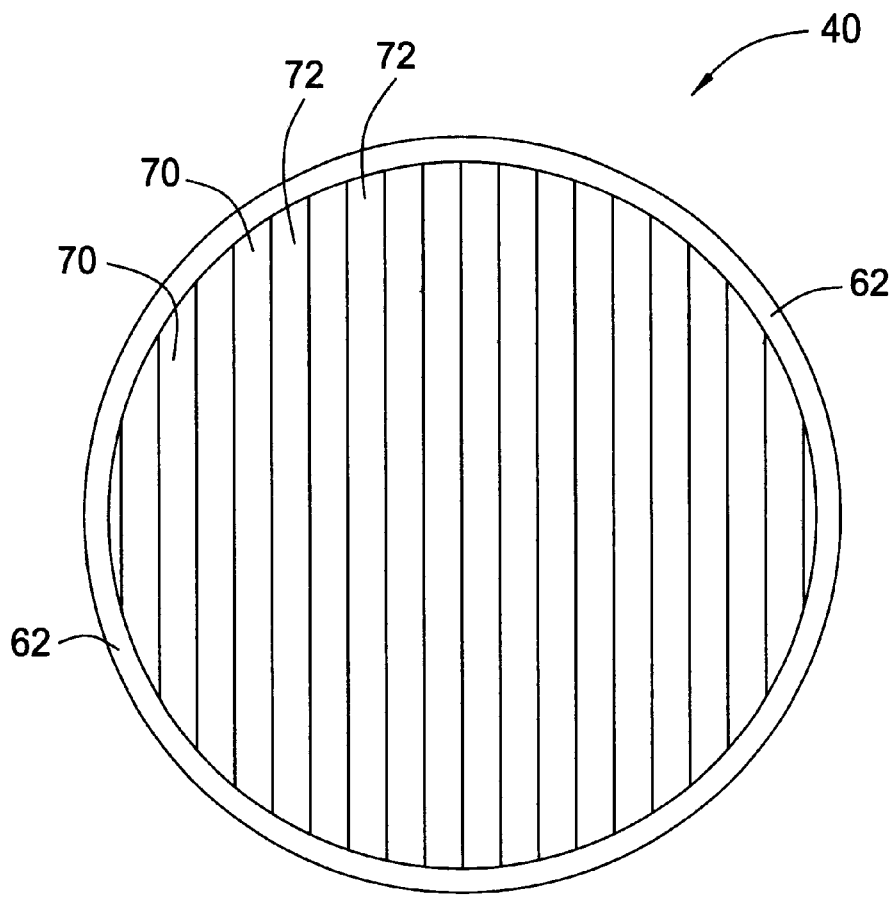
FIGS. 7(a) and (b) show face and side views of an exemplary bottom cooling member having gas channels formed therein.
Figure 7B:
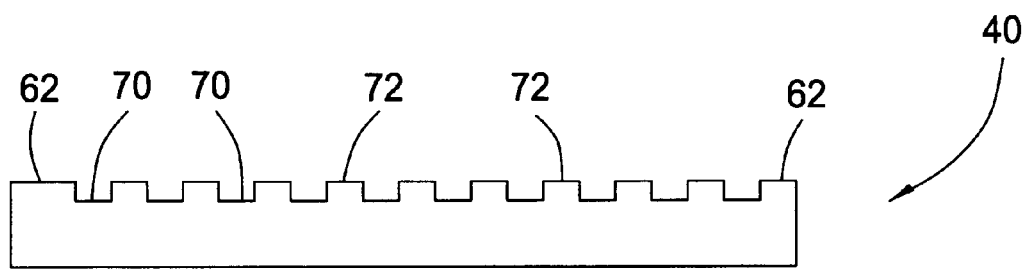

Referring briefly to FIGS. 7(a) and 7(b), face and side views of an exemplary bottom cooling member having gas channels formed therein are shown. The channels 70 and ridges 72 are shown in an alternating parallel pattern. This pattern supports a substrate on the ridges 72 and allows gas to flow through the channels 70. The edge 62 forms a sealing surface around the perimeter of the member 40. This pattern is only one of many possible patterns that may be incorporated into the top and/or bottom cooling member surfaces, including a flat surface with no pattern at all.

Regardless of the presence or absence of patterns or channels in the cooling member faces, the cooling members should not contact the top surface of a substrate, but may contact the bottom surface of the substrate. The physical contact of the substrate bottom surface with the bottom cooling member, whether flat or patterned, provides sufficient cooling within the present invention. However, the substrate and bottom cooling member may not be perfectly planar and, therefore, the contact will not be uniform over the entire bottom surface area of the substrate. Nonuniform contact may lead to nonuniform cooling. In these types of circumstances it may be preferred to improve the uniformity of cooling by employing only a small number of pins or knobs on the bottom cooling member to support the substrate a fixed distance above the cooling surface. The use of pins will minimize the surface area in physical contact with the substrate and maximize the surface area exposed to the gas which maintains a relatively uniform temperature.

Figure 8:
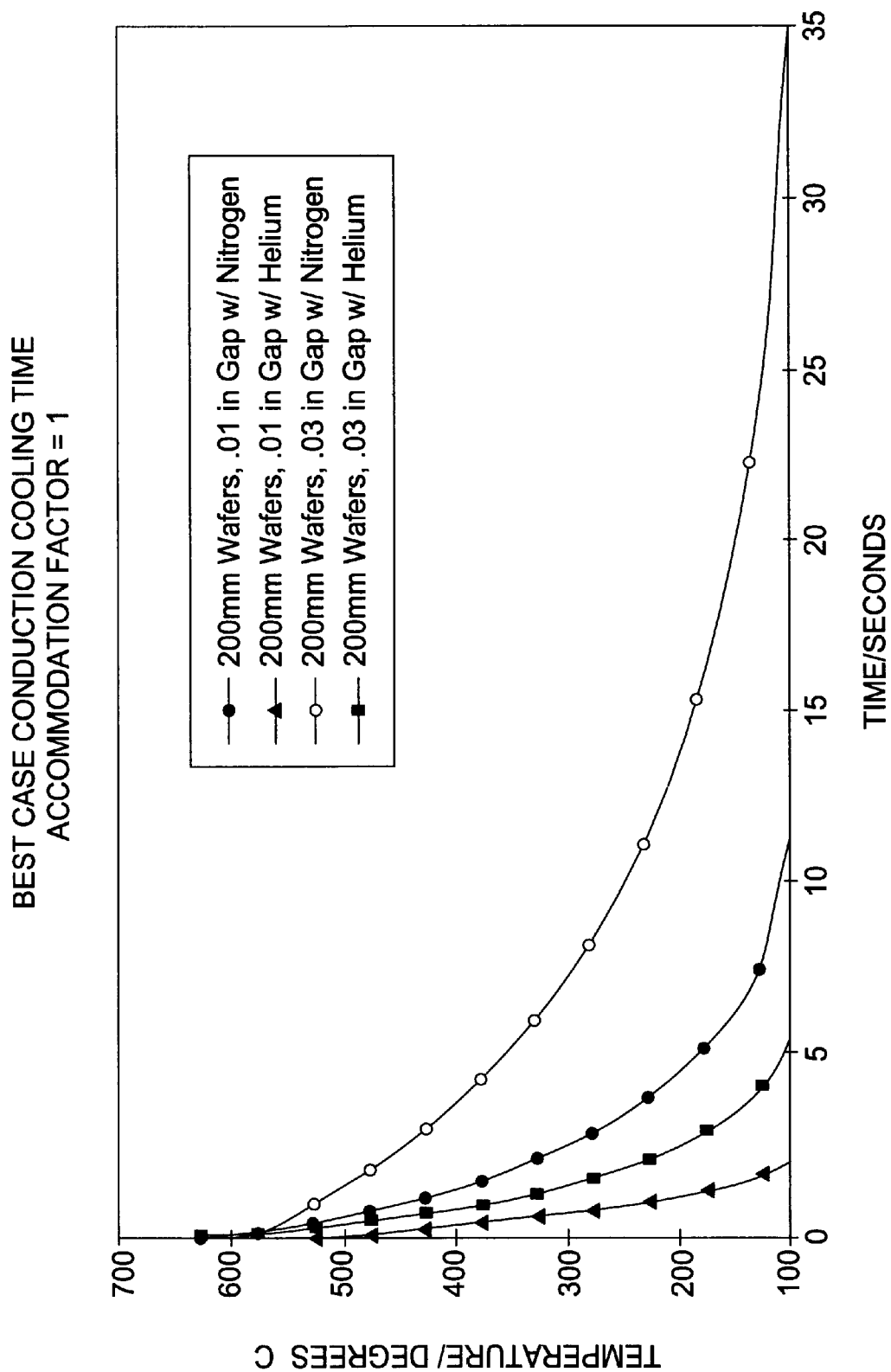
FIG. 8 is a graph showing the wafer temperature over time using the cooldown chamber with different inert gases and wafer spacings.

Now referring to FIG. 8, a graph shows the rate of substrate temperature reduction as a function of time caused by thermal conduction in cooldown chambers of the present invention. The graph provides a temperature profile obtained for 200 mm substrates under four sets of conditions: (1) 0.01 inch gaps filled with nitrogen, (2) 0.01 inch gaps filled with helium, (3) 0.03 inch gaps filled with nitrogen, and (4) 0.03 inch gaps filled with helium. The results indicate that the 0.01 inch gap with helium provides the greatest cooling. However, helium is more difficult than nitrogen to evacuate from the cooldown chamber due to its extremely light weight and is also more expensive than nitrogen. Therefore, nitrogen is generally preferred for use in the cooldown chamber of the present invention, most preferably with cooling members providing a gap of about 0.01 inch. The approximately 11 seconds required to cool the substrate from >600° C. to about 100° C. is much improved from the about 21 seconds required by conventional cooling chambers.

While it is a fact that thermal conduction increases with increasing gas pressure, there is diminishing return at gas pressures exceeding about 20 torr. Therefore, to minimize the amount of gas introduced into the chamber and minimize the magnitude of any pressure excursions, it is preferred that the gas pressure during cooling be maintained between about 5 and about 30 torr, with about 20 torr being most preferred.

The contacting interface between the top and bottom cooling members 38,40 may incorporate an O-ring seal to help maintain the pressure within the clam shell enclosure while minimizing the amount of gas escaping into the cooldown chamber 22 and ultimately into the buffer chamber 18. It is also sufficient that the top and bottom cooling members have machined smooth surfaces that mate together to restrict the escape of gas from the enclosure. Furthermore, it may not even be necessary to form any type of seal between the cooling members 38,40 due to the relatively low pressures (about 5 to about 30 torr) within the enclosure and the short period of time in which the pressure must be maintained (about 11 seconds). In fact, it may be preferred in applications that are insensitive to the gas, such as nitrogen, that no seal be incorporated in order to minimize the generation of particles.

Once the desired pressure has been obtained within the enclosure, the substrate is allowed to cool over a predetermined period of time. It should be recognized that the length of this period of time is effected by the initial substrate temperature, the gas pressure, the gas conductivity, and the proximity of the substrate surfaces to the cooldown members and ultimately with the surface temperature of the cooldown members themselves. It is generally not necessary to incorporate a thermocouple or other temperature measuring devices adjacent to a substrate due to the consistent heat transfer provided by the cooldown chamber of the present invention. Rather, the final temperature of the substrate may be calibrated to the residence time of the substrate within the cooling members. In this manner the substrate process recipe may dictate a fixed period of time in which the substrate must spend cooling within the cooldown chamber.

Once the substrate has been in the cooling enclosure for a given period of time, the cooldown chamber pedestal is lowered leaving the wafer suspended on the lift pin. The gases originally introduced into the closed clam shell cooling members diffuse into the remainder of the cooldown chamber volume and dissipate the pressure. In applications where pressure sensitive operations are incorporated within the cluster tool or where incompatible gases are used, it may be desirable at this point to pump and evacuate the gases from the cooldown chamber prior to opening the slit valve.

In another aspect of the invention, the cooldown chamber 22 may be incorporated between a buffer chamber 18 and a transfer chamber 30 of the cluster tool as shown in FIG. 1. Where the cooldown chamber serves a dual purpose of cooling substrates and separating a high pressure transfer chamber and a lower pressure buffer chamber, it is necessary that the cooldown chamber incorporate a slit valve on each side of the chamber.

As shown in FIG. 2, the upper cooling member 38 is preferably fixed in place and may be mounted on or incorporated in a removable lid of the cooldown chamber. It is also preferred that the upper cooling member have a rim formed about its outer perimeter with an inner diameter that is greater than the outer diameter of the substrate. The rim extends downward to communicate with the lower cooling member. It is this rim in cooperation with the lower surface of the upper cooling member and the top surface of the lower cooling member that defines the reduced volume enclosure in which the substrate is cooled.

While the foregoing is directed to the preferred embodiment of the present invention, other and further embodiments of the invention may be devised without departing from the basic scope thereof, and the scope thereof is determined by the claims which follow.

What is claimed is:

1. A cooldown chamber comprising:
   (a) an enclosure;
   (b) a passageway between the enclosure and a buffer chamber of a cluster tool;
   (c) a first cooling member coupled to an inside wall of the enclosure;
   (d) a second cooling member coupled to a pedestal for receiving a substrate thereon, wherein the second cooling member can be selectively positioned adjacent the first cooling member to form a cooling region therebetween; and
   (e) a gas source for providing gas to the cooling region.

2. The cooldown chamber of claim 1, further comprising a source of a cooling fluid, said source in communication with the first and second cooling members.

3. The cooldown chamber of claim 2 wherein the cooling fluid is chilled water.

4. The cooldown chamber of claim 1, further comprising a slit valve within the passageway.

5. The cooldown chamber of claim 4, further comprising an exhaust port and a vacuum pump for evacuating the cooldown chamber.

6. The cooldown chamber of claim 4, further comprising a second passageway between the enclosure and a second buffer chamber of a cluster tool and a second slit valve within the second passageway.

7. The cooldown chamber of claim 1 wherein the first cooling member is fixed to an upper surface of the cooldown chamber.

8. The cooldown chamber of claim 7 wherein the upper surface of the cooldown chamber is a lid.

9. The cooldown chamber of claim 1 wherein an upper surface of the second cooling member has a plurality of raised members for holding the substrate a fixed distance above the second cooling member.

10. The cooldown chamber of claim 9 wherein the fixed distance between the substrate and the upper surface of the second cooling member is between about 0.01 and about 0.03 inches.

11. The cooldown chamber of claim 1 wherein the pedestal comprises a lift pin assembly for raising and lowering the substrate.

12. The cooldown chamber of claim 1 wherein the first cooling member has a rim extending towards the second cooling member.

13. The cooldown member of claim 12 wherein the rim of the first cooling member extends a sufficient distance towards the second cooling member to provide a gap of between about 0.01 and about 0.03 inches between the lower surface of the first cooling member and the upper surface of the substrate.

14. The cooldown chamber of claim 12 wherein the second cooling member can be selectively positioned in contact with the rim of the first cooling member so that the cooling region forms a cavity.

15. The cooldown chamber of claim 1 wherein the second cooling member has a rim extending towards the first cooling member.

16. The cooldown chamber of claim 15 wherein the second cooling member can be selectively positioned with the rim in contact with the first cooling member so that the cooling region forms a cavity.

17. The cooldown chamber of claim 1, wherein the cooling region is smaller than the cooldown chamber.

18. The cooldown chamber of claim 1, wherein the gas-containing volume of the cooling region is less than the cooldown chamber volume.

19. The cooldown chamber of claim 1, wherein the gas-containing volume of the cooling region is less than about 10 percent of the cooldown chamber volume.

20. A cluster tool having a buffer chamber separating individual processing chambers, the cluster tool comprising:
    a cooldown chamber, wherein the cooldown chamber comprises:
    (a) an enclosure;
    (b) a passageway between the enclosure and the buffer chamber;
    (c) a first cooling member coupled to an inside wall of the enclosure;
    (d) a second cooling member coupled to a pedestal for receiving a substrate thereon, wherein the second cooling member can be selectively positioned adjacent the first cooling member to form a cooling region therebetween; and
    (e) a gas source for providing gas to the cooling region.

21. The cooldown chamber of claim 20, further comprising a source of a cooling fluid, said source in communication with the first and second cooling members.

22. The cooldown chamber of claim 20, further comprising a slit valve within the passageway.

23. The cooldown chamber of claim 22, further comprising an exhaust port and a vacuum pump for evacuating the cooldown chamber.

24. The cooldown chamber of claims 22, further comprising a second passageway between the enclosure and a second buffer chamber and a second slit valve within the second passageway.

25. A method for operating a high pressure cooldown chamber on a cluster tool having a low pressure transfer chamber, comprising the steps of:
    (a) transferring a substrate from the transfer chamber into the cooldown chamber, wherein the cooldown chamber comprises:
       (i) an enclosure;
       (ii) a passageway between the enclosure and a buffer chamber of a cluster tool;
       (iii) a first cooling member coupled to an inside wall of the enclosure;
       (iv) a second cooling member coupled to a pedestal for receiving the substrate thereon; and
       (v) a gas source for providing a gas between the first and second cooling members;
    (b) receiving the substrate on the second cooling member;
    (c) positioning the second cooling member in a sealing relationship with the first cooling member to form a cooling cavity therebetween, wherein the cavity contains the substrate;
    (d) flowing the gas into the cooling cavity at a pressure that is greater than the pressure in the transfer chamber; and
    (e) cooling the substrate.

26. The method of claim 25, wherein the gas is an inert gas.

27. The method of claim 26 wherein the inert gas is helium.

28. The method of claim 26, wherein the inert gas provides a pressure greater than about 5 torr in the cavity.

29. The method of claim 28 wherein the inert gas provides a pressure between about 5 and about 30 torr.

30. The method of claim 29, wherein the inert gas provides a pressure of about 20 torr.

31. The method of claim 25 wherein the gas is nitrogen.

32. The method of claim 25, wherein the gas-containing volume of the cooling cavity is less than the cooldown chamber volume.

33. The method of claim 25, wherein the gas-containing volume of the cooling cavity is less than about 10 percent of the cooldown chamber volume.

34. The method of claim 25, further comprising the steps of:

(f) moving the second cooling member away from the first cooling member to release the gas;

(g) removing the substrate from the cooldown chamber.

* * * * *